US008437213B2

(12) United States Patent
Deng et al.

(10) Patent No.: US 8,437,213 B2
(45) Date of Patent: May 7, 2013

(54) CHARACTERIZATION OF BITS IN A FUNCTIONAL MEMORY

(75) Inventors: Xiaowei Deng, Plano, TX (US); Wah K. Loh, Richardson, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/347,928

(22) Filed: Dec. 31, 2008

(65) Prior Publication Data
US 2009/0175113 A1 Jul. 9, 2009

Related U.S. Application Data

(60) Provisional application No. 61/018,687, filed on Jan. 3, 2008.

(51) Int. Cl.
*G11C 5/14* (2006.01)
(52) U.S. Cl.
USPC ........................................................ 365/226
(58) Field of Classification Search .................. 365/154, 365/226
See application file for complete search history.

(56) References Cited

U.S. PATENT DOCUMENTS

| 4,969,125 | A | * | 11/1990 | Ciraula et al. ................ 365/203 |
| 5,956,279 | A | * | 9/1999 | Mo et al. ...................... 365/201 |
| 5,999,466 | A | * | 12/1999 | Marr et al. .................... 365/201 |
| 6,081,465 | A | * | 6/2000 | Wang et al. ................... 365/201 |
| 6,374,377 | B1 | | 4/2002 | Guddat et al. |
| 2005/0013180 | A1 | * | 1/2005 | Koyama et al. ............... 365/199 |
| 2005/0128852 | A1 | * | 6/2005 | Deng et al. .................... 365/226 |
| 2008/0084781 | A1 | * | 4/2008 | Piorkowski ................ 365/233.1 |

OTHER PUBLICATIONS

Wong, et al.; "Electrical analysis to fault isolate defects in 6T memory cell;" Proc. IEEE IPFA, Jul. 2002; pp. 101-104.
Mauck, et al.; "A design for test technique for parametric analysis of SRAM: on-die low yield analysis;" Proc. IEEE ITC, 2004; pp. 106-113.
Mauck, et al.; "On-Die Parametric Analysis of SRAM;" Proceedings from the 30th International Symposium for Testing and Failure Analysis; Nov. 14-18, 2004; Worcester, Massachusetts; pp. 585-594.
Kong, et al.; "Multi-level Approach for High-Precision Cache Fault Isolation-Case Study: Itanium II Processor Low Voltage Cache Yield Improvement;" Proceedings from the 30th International Symposium for Testing and Failure Analysis; Nov. 14-18, 2004; Worcester, Massachusetts; pp. 498-505.
Xiaowei Deng et al., Characterization of Bit Transistors in a Functional SRAM, Symposium on VLSI Digest of Technical Papers, Jun. 18-20, 2008, pp. 44-45. DOI; 10.1109/VLSIC.2008.4585945. IEEE Xplore, Honolulu, HI.

* cited by examiner

*Primary Examiner* — Anthan Tran
(74) *Attorney, Agent, or Firm* — Rose Alyssa Keagy; Wade J. Brady, III; Frederick J. Telecky, Jr.

(57) ABSTRACT

Embodiments of the present disclosure provide an integrated circuit including a functional memory and methods of characterizing a component or a defect of a memory cell in the functional memory. In one embodiment, the functional memory includes row and column periphery units having periphery sourcing and sinking voltage supply ports, an array of memory cells organized in rows and columns and a word line controlled by a word line driver that provides row access to a memory cell of the array. Additionally, the functional memory also includes a bit line controlled by a direct bit line access circuit that provides direct bit line access to the memory cell through a bit line analog access port and an independent voltage supply port.

36 Claims, 12 Drawing Sheets

| BIT | FAIL TYPE | PG Vtcc (V) | | DR Vtcc (V) | | LD Vtcc (V) | |
|---|---|---|---|---|---|---|---|
| | | LEFT | RIGHT | LEFT | RIGHT | LEFT | RIGHT |
| 1 | WRITE | 0.644 | 0.888 | 0.525 | 0.600 | 0.663 | 0.563 |
| 2 | WRITE | 0.663 | 0.688 | 0.500 | 0.613 | 0.706 | 0.275 |
| 3 | DISTURB | 0.533 | 0.364 | 0.266 | 0.538 | 0.617 | 0.625 |

# CHARACTERIZATION OF BITS IN A FUNCTIONAL MEMORY

CROSS-REFERENCE TO PROVISIONAL APPLICATION

This application claims the benefit of U.S. Provisional Application Ser. No. 61/018,687, filed by Xiaowei Deng, Wah Kit Loh and Theodore W. Houston on Jan. 3, 2008, entitled "Characterization of Bits in a Functional Memory", commonly assigned with this application and incorporated herein by reference.

TECHNICAL FIELD

The present disclosure is directed, in general, to an integrated circuit and, more specifically, to characterization of a functional memory having an array of memory cells and methods of characterizing components and defects in the functional memory.

BACKGROUND

Memory cells as bits are frequently used in integrated circuits and, they often require a major portion of an integrated circuit. Consequently, memory cells are usually designed with minimum area while meeting the required performance and yield targets for the memory. To achieve minimum area, near-minimum device sizes and smaller-than-logic design rules are usually used in memory cells. As a result, memory bit failures due to transistor variation and subtle process defects often determine the yield of the memory and therefore, the yield of the integrated circuit. To better understand the root cause of memory bit fail for memory cell design and allow further process improvement, expensive and often time-consuming and destructive physical failure analysis (PFA) is used after a functional bit failure signature occurs. With continued technology scaling, PFA has become more difficult and improvements in testing capabilities would prove beneficial in the art.

SUMMARY

Embodiments of the present disclosure provide an integrated circuit including a functional memory and methods of characterizing a component or a defect of an integrated circuit. In one embodiment, the functional memory includes row and column periphery units having periphery sourcing and sinking voltage supply ports, an array of memory cells organized in corresponding rows and columns and a word line controlled by a word line driver that provides row access to a memory cell of the array. Additionally, the functional memory also includes a bit line controlled by a direct bit line access circuit that provides direct bit line access to the memory cell through a bit line analog access port. The functional memory further includes an independent voltage supply port connected to the memory cell.

In another aspect, the method of characterizing a component of an integrated circuit includes providing a functional memory including row and column periphery units that have periphery sourcing and sinking voltage supply ports, providing an array of memory cells organized in rows and columns in the functional memory and providing row access to a memory cell of the array through a word line controlled by a word line driver. The method also includes accessing directly a bit line of the memory cell through a direct bit line access circuit via a bit line analog access port and controlling an independent supply voltage on a corresponding independent voltage supply port to characterize a component of the memory cell.

In yet another aspect, the method of characterizing a defect of an integrated circuit includes providing a functional memory including row and column periphery units that have periphery sourcing and sinking voltage supply ports, providing an array of memory cells organized in rows and columns in the functional memory and providing row access to a memory cell of the array through a word line controlled by a word line driver. The method also includes accessing directly a bit line of the memory cell through a direct bit line access circuit via a bit line analog access port and controlling an independent supply voltage on a corresponding independent voltage supply port to characterize a defect of the memory cell.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Electrical failure analysis based on direct bit line access may be used to narrow possible causes of bit transistor failures before a destructive failure analysis is conducted. However, its usefulness is limited since it depends on SPICE simulation of a bit with an assumed defect mechanism to interpret the measured bit line current-voltage (I-V) curves.

Additionally, to understand the impact of bit transistor variation on memory yield for memory cell design and process improvement, bit transistors may be characterized from parametric test structures. However, such data is often of marginal use in understanding whether a bit failure in the functional memory is caused by bit transistor variation, since the latter is known only after PFA (e.g., nanoprobing) is conducted. Early failure rate (EFR) bit transistor variations are not readily available, since parametric test structures for analysis are not normally packaged to sustain a burn-in process. For these reasons, the current approach to memory cell characterization limits the usefulness of measurements for memory cell development and for integrated circuit process development and monitoring.

Embodiments of the present disclosure provide structural schemes and associated methods for testing a functional memory that allow individual transistors and defect parameters (e.g., abnormal leakages including short-circuits and open-circuits) for any bit position in the functional memory to be directly and quantitatively characterized. Generally, the embodiments improve the usefulness of measurements for memory cell development, as well as for associated integrated circuit process and design development, monitoring and control.

Advantageously, this provides direct correlation between a bit failure and the measured characteristics of bit transistors or defect-induced leakages. A further advantage is the facilitation of collecting statistically significant bit transistor data, including transistor threshold voltage and local threshold voltage mismatch data for statistical analysis. This analysis may include EFR (e.g., NBTI) analysis.

Figure 1A:
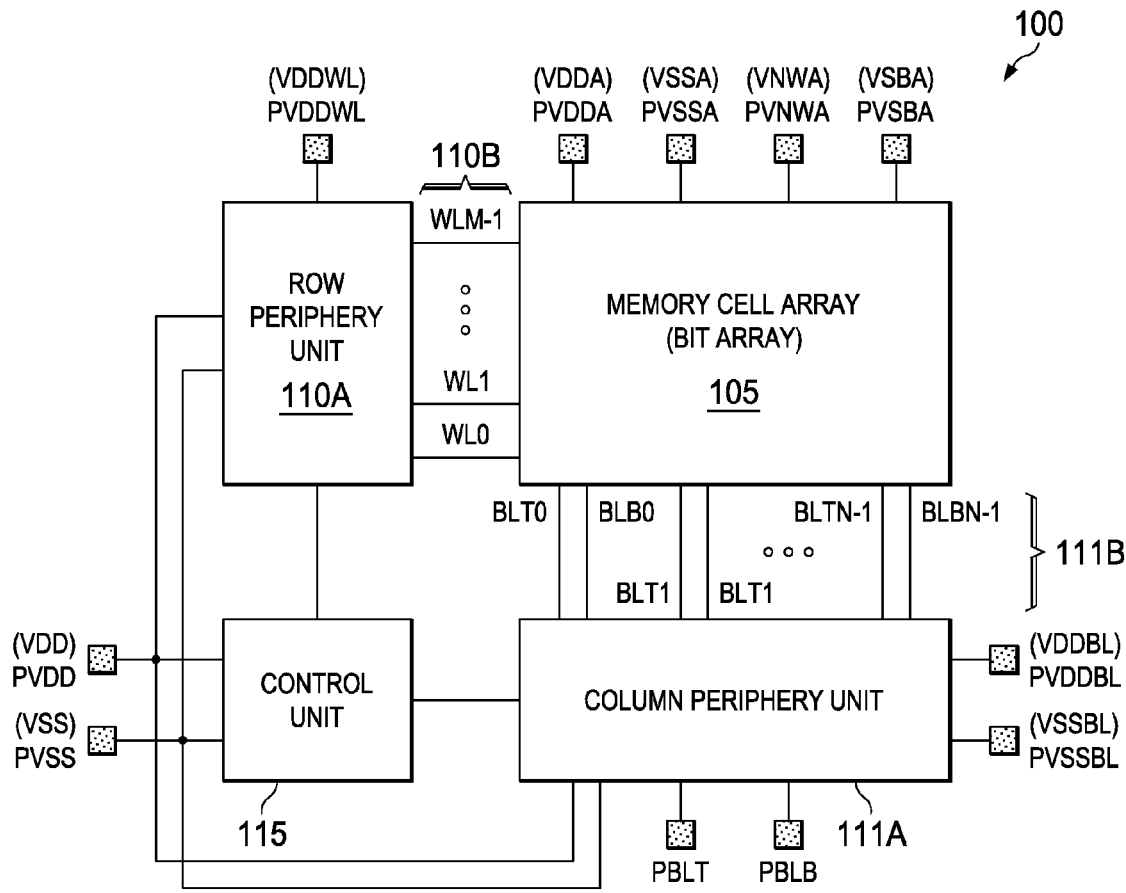
FIG. 1A illustrates a block diagram of an integrated circuit that includes a functional static random access memory (SRAM) having direct bit access (DBA) constructed according to the principles of the present disclosure.

FIG. 1A illustrates a block diagram of an integrated circuit that includes a functional static random access memory (SRAM), generally designated 100, having direct bit access (DBA) constructed according to the principles of the present disclosure. In general, embodiments of the functional SRAM 100 may be included in the integrated circuit as an embedded memory connected to other portions of the integrated circuit. Alternatively, the functional SRAM 100 may be a discrete memory contained in the integrated circuit.

The functional SRAM 100 includes a memory cell array 105, a row periphery unit 110A controlling M word lines 110B (i.e., WL0 through WLM-1), a column periphery unit 111A controlling N pairs of bit lines 111B (i.e., BLT0, BLB0 through BLTN-1, BLBN-1) and a control unit 115 controlling the row and column periphery units 110A, 111A. The row and column periphery units 110A, 111A and the control unit 115 are connected to sourcing and sinking voltage supplies VDD, VSS through sourcing and sinking ports PVDD, PVSS, respectively.

The memory cell array 105 includes an independent array sourcing voltage supply VDDA corresponding to an independent voltage supply port PVDDA, an independent array sinking voltage supply VSSA corresponding to an independent voltage supply port PVSSA, an independent array NWELL supply VNWA corresponding to an independent voltage supply port PVNWA and an independent array substrate voltage supply VSBA corresponding to an independent voltage supply port PVSBA.

The row periphery unit 110A includes an independent word line driver sourcing voltage supply VDDWL corresponding to an independent voltage supply port PVDDWL. The column periphery unit 111A includes a pair of bit line analog access ports PBLT, PBLB, an independent bit line pre-charge sourcing voltage supply VDDBL corresponding to an independent voltage supply port PVDDBL and an independent bit line write sinking voltage supply VSSBL corresponding to an independent voltage supply port PVSSBL. The bit line analog access ports PBLT and PBLB are ports for direct bit line access to the bit lines BLT and BLB through direct bit line access circuitry.

The independent voltage supplies and ports allow independent bias or control of various nodes of each memory cell in the memory cell array 105 and its peripheries and thereby allow individual components and defects to be directly accessed and characterized. This direct bit line access in conjunction with direct word line access and direct array power line access provided by embodiments of the present disclosure allow direct (analog) testing of the memory cell array 105 through the various accessed ports. Additionally, by applying independently swept voltages or overdrive voltages on the word line and the array power line, characteristics of each transistor in the memory cell (or bit) may be measured without significant influence from other transistors. This typically provides improvement in both failure analysis time and accuracy. It also enables quantification of row-to-row and column-to-column local statistical variations of transistor parameters, such as threshold voltage (Vt).

The term "functional memory" or "functional SRAM" refers to a memory or SRAM whose bits may be accessed (written to and read from) in a normal digital style. That is, input and output signals of the memory or SRAM are digital signals and travel to and from bits (i.e., memory cells that form bit positions) through digital buffers, digital write circuits or sense amplifiers. For example, a memory or SRAM that does not use digital buffers, digital write circuits or sense amplifiers for writing to or reading from the bits is not a functional memory or SRAM.

The term "port" as used herein, refers to a structure for conducting a signal for a circuit or voltage supply. One port is not generally connected to another port, unless explicitly stated.

In a variation of the SRAM, one or more voltage supplies may be connected together. For example, VSBA and VSSA may be connected to VSS while VNWA may be connected to VDDA.

The term "connect" refers to a connection through either (a) electrically conductive layers of the integrated circuit, including substrate and NWELL, without passing through a circuit element such as a transistor or (b) a transistor.

The term "independent voltage supply" refers to a voltage supply whose voltage can be biased without being constrained by another voltage supply.

The term "direct bit line access" refers to accessing a bit line in a direct pass through or analog style such that an analog voltage or current (not just the logic '0' and '1' levels) can be transmitted between a bit line analog access port and the bit line without substantial signal loss.

The term short circuit or "short" as used herein is an unintended high conductivity connection between two points of an electric circuit, where the connection may still be resistive but the resistance is not as high as in the case where there is no defect.

The term open circuit or "open" as used herein is an unintended low conductivity connection between two points of an electrical circuit, where the connection may still be conductive but the conductivity is not as high as in the case where there is no defect.

Figure 1C:
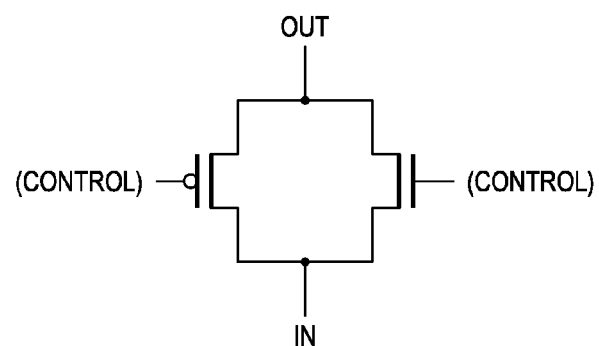
FIG. 1C illustrates a schematic diagram of a complementary MOS (CMOS) multiplexer.
Figure 1B:
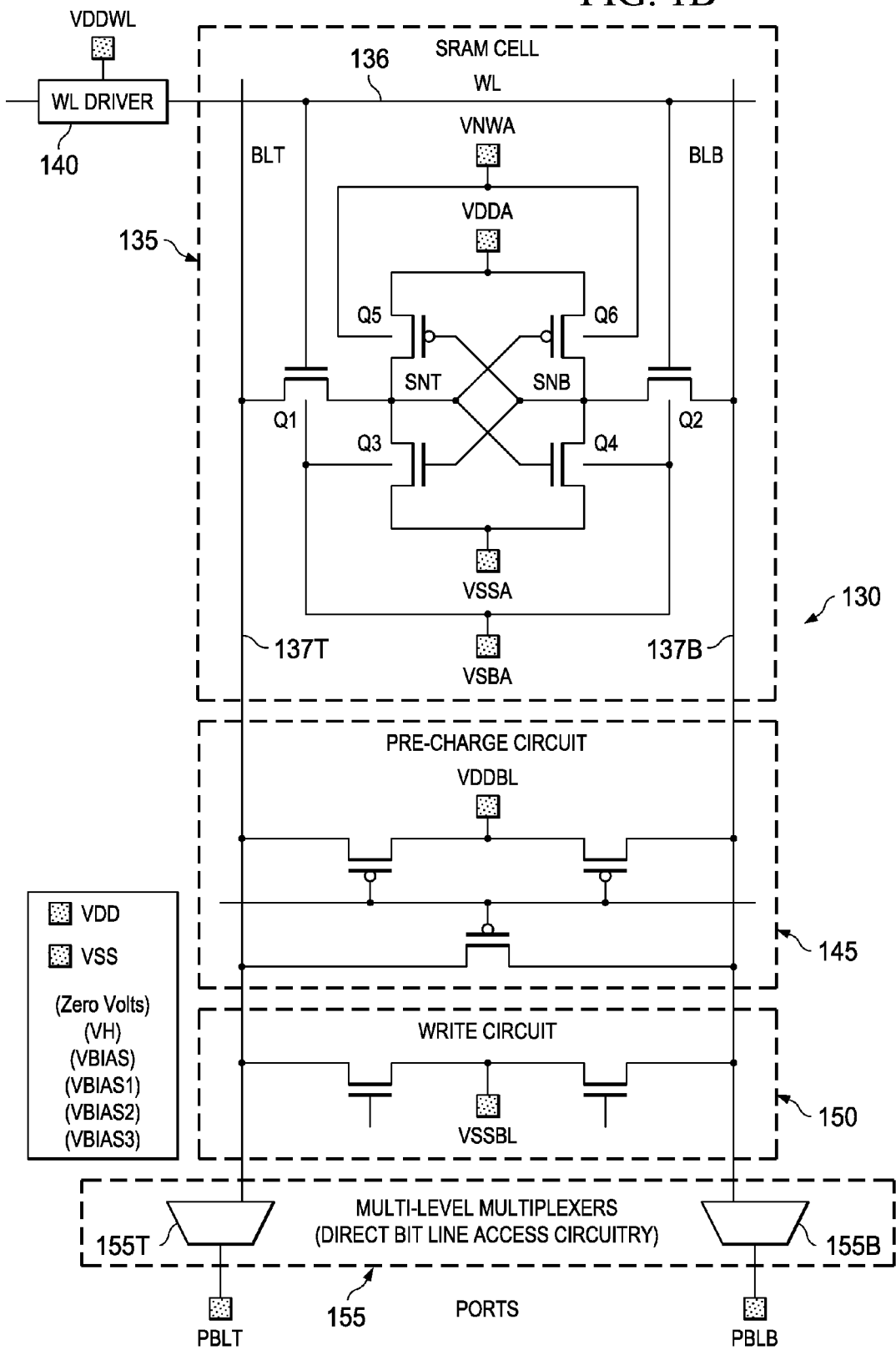
FIG. 1B illustrates a schematic diagram of an embodiment of a portion of a functional SRAM employing DBA as may be employed in the functional SRAM 100 of FIG. 1A.

FIG. 1B illustrates a schematic diagram of an embodiment of a portion of a functional SRAM employing DBA, generally designated 130, as may be employed in the functional SRAM 100 of FIG. 1A. The portion of the functional SRAM 130 includes an SRAM memory cell 135, a word line driver 140 in a row periphery unit (not shown) connected to a word line 136 (generally designated WL) of the SRAM memory cell 135, a pre-charge circuit 145 and a write circuit 150 in a column periphery unit (not shown) connected to a pair of bit lines 137T, 137B (generally designated BLT, BLB) for the SRAM memory cell 135. The portion of the functional SRAM 130 also includes multi-level multiplexers 155 having direct bit line access circuitry employed in multiple levels of bit line multiplexers 155T, 155B. The portion of the functional SRAM 130 further includes a plurality of independent voltage supply ports as generally defined in FIG. 1A and indicates a collection of test voltages that will be discussed subsequently.

The SRAM cell 135 is typical of a six-transistor (6T) SRAM cell having left/right NMOS pass gate transistors Q1/Q2, left/right NMOS driver transistors Q3/Q4, and left/right PMOS load transistors Q5/Q6. The SRAM cell 135 provides two storage nodes SNT and SNB (T stands for True and B stands for Bar or complement) for storing a bit state. The pair of bit lines 137T, 137B (BLT, BLB) provide respective access to the two storage nodes SNT and SNB. The word line 136 (WL) provides control of bit line access (enabling or disabling) of the SRAM cell 135 through the pair of bit lines BLT, BLB.

The SRAM cell 135 is connected to an independent array sourcing voltage supply VDDA, an independent array sinking voltage supply VSSA, an independent array PMOS NWELL voltage supply VNWA and an independent array NMOS substrate voltage supply VSBA. These voltage supplies are respectively connected to independent voltage supply ports PVDDA, PVSSA, PVNWA, and PVSBA (not specifically shown in FIG. 1B) as discussed with respect to FIG. 1A.

When the word line WL is selected, the word line voltage is driven to a supply voltage VDDWL. Similarly, when the pre-charge circuit 145 is enabled, both the pair of bit lines BLT, BLB are driven (i.e., pre-charged) to a supply voltage VDDBL. When a bit is written, only one of the pair of bit lines BLT, BLB is driven to a supply voltage VSSBL.

The multiple levels of bit line multiplexers 155T, 155B employ analog multiplexers using complementary MOS (CMOS) multiplexers. That is, both PMOS and NMOS transistors are connected in parallel at sources and drains, as shown in FIG. 1C. This effectively provides an all-PMOS path and an all-NMOS path connected in parallel between the bit line analog access ports and the selected local bit lines, wherein the PMOS and the NMOS can be other p-channel and n-channel devices. When the pair of bit lines BLT, BLB is selected for direct bit line access in a DBA mode, an analog voltage or current can pass between PBLT and BLT or between PBLB and BLB with little signal loss.

In a variation of the SRAM cell 135, a voltage supply may be further split into two or more independent supplies. In FIG. 1B, for example, VDDA may be split into VDDAL and VDDAR for left and right loads, respectively. VSSA may be split into VSSAL and VSSAR for left and right drivers, respectively. And, the word line WL may be split into WLL and WLR for left and right pass gates, respectively, with WLL and WLR being driven by separate WL drivers that are respectively supplied by VDDWLL and VDDWLR.

Figure 1D:
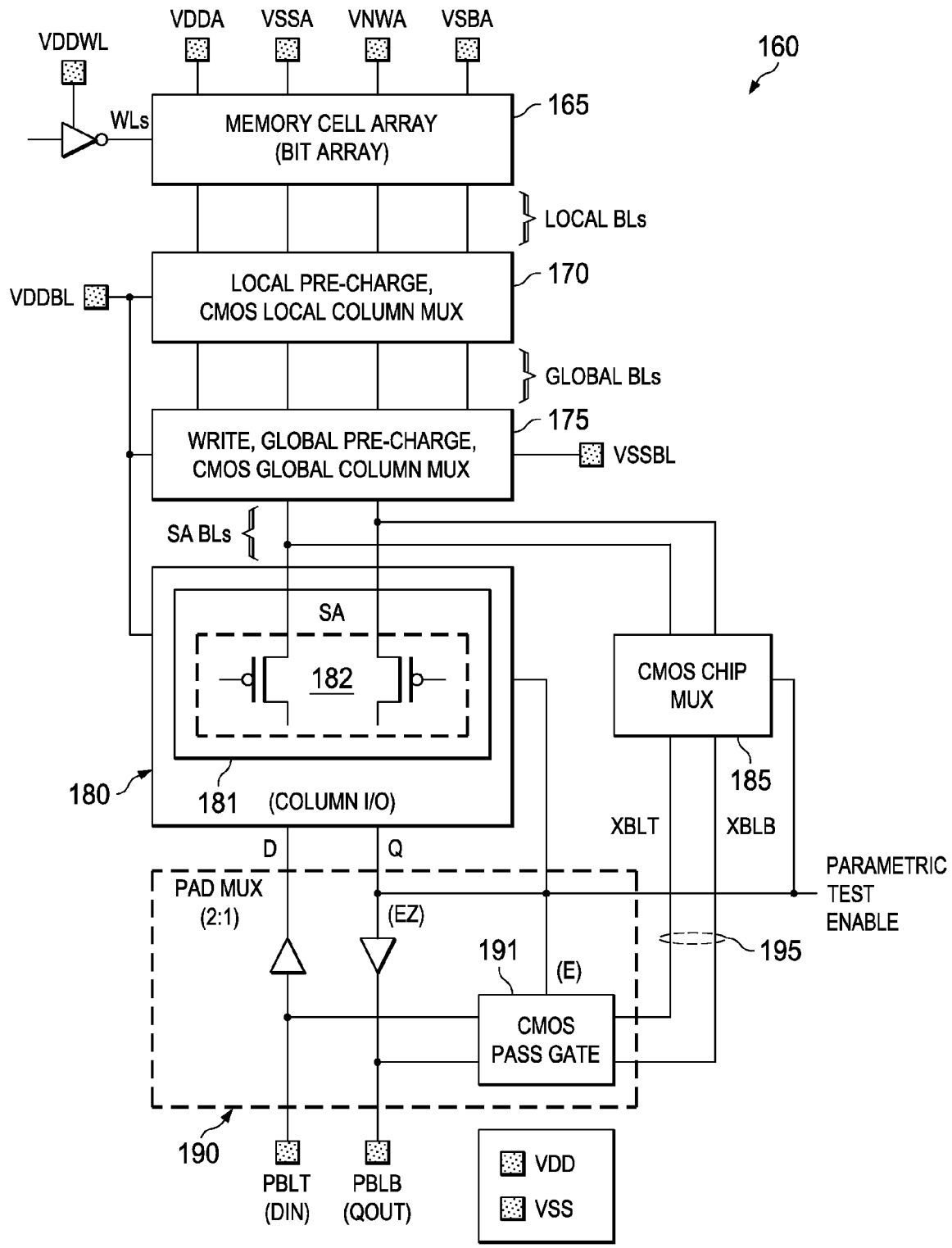
FIG. 1D illustrates a block diagram that includes direct bit line access circuitry as may be employed with the SRAM memory cell of FIG. 1B and the functional SRAM of FIG. 1A.

FIG. 1D illustrates a block diagram that includes direct bit line access circuitry, generally designated 160, as may be employed with the SRAM memory cell of FIG. 1B and the functional SRAM of FIG. 1A. The block diagram 160 includes a memory cell array 165 controlled by word lines (WLs) and both local and global bit lines (BLs) through a local column multiplexer 170 and a global column multiplexer 175, respectively.

The block diagram 160 also includes a block 180 that contains a sense amplifier (SA) 181 and column input/output, a CMOS chip multiplexer 185 and a pad multiplexer 190 employing a CMOS pass gate 191. Direct bit line access circuitry is included in the local and global column multiplexers 170, 175, the CMOS chip multiplexer 185 and the pad multiplexer 190 that provides a direct bit line access path 195 to a memory cell in the memory cell array 165. This direct bit line access path 195 is activated by a parametric test enable (PTE) control signal.

The Direct bit line access circuitry provides several advantageous features. For example, the local and global column multiplexers 170, 175 are shared between a functional mode and a DBA mode to save silicon area. Additionally, bit line isolation PMOS transistors 182 are included in the sense amp (SA) block 181 such that the SA block 181 is isolated from SA bit lines when the PTE control signal is enabled during parametric measurement.

As another added feature, all of the multiplexers employed along the direct bit line access path 195 in the DBA mode are constructed using the complementary MOS transistors discussed with respect to FIG. 1B. The complementary MOS transistors allow both high and low voltage levels to be easily and accurately accommodated with little signal loss. As yet another added feature, the PBLT and PBLB ports are respectively shared with DIN and QOUT ports to save the port count and silicon area.

FIGS. 2A, 2B, 2C and 2D illustrate diagrams of respective word line drivers 200, 220, 240, 260 as provided by embodiments of the present disclosure.

Figure 2A:
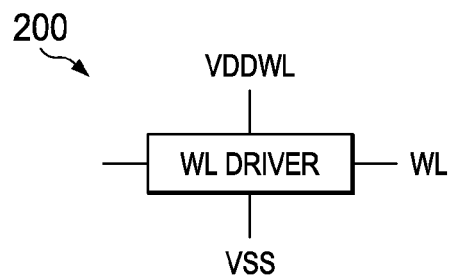
FIGS. 2A, 2B, 2C and 2D illustrate diagrams of respective word line drivers as provided by embodiments of the present disclosure.

In FIG. 2A, the word line (WL) driver 200 is constructed according to the principles of the present disclosure. The WL driver 200 employs a sourcing voltage supply VDDWL and a sinking voltage supply VSS. When not selected, the word line (WL) remains at VSS. When selected, the WL is driven to VDDWL, typically through a large PMOS logic transistor. When characterizing transistors or defect-induced shorts (or short currents or leakage currents) and opens (or open currents) in a bit using DBA, the selected WL may need to be biased to a voltage close to zero volts.

Figure 2B:
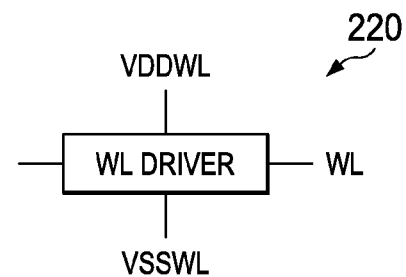

In FIG. 2B, an alternative WL driver 220 employs an independent voltage supply VSSWL instead of VSS. VSSWL can be biased below the VSS level so that there is enough gate-to-source voltage for driving PMOS transistors of a selected WL to remain conducting even with a low value of VDDWL.

Figure 2C:
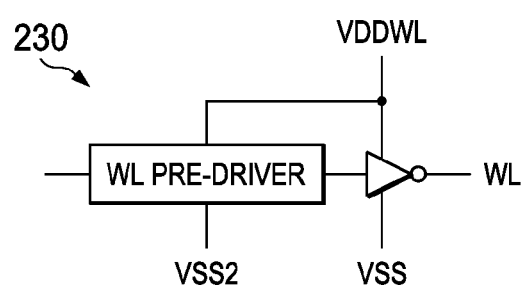

In FIG. 2C, another alternative WL driver 230 is illustrated. It is similar to the WL driver 200 except that the sinking voltage supply of a WL pre-driver is an independent voltage supply VSS2, separated from VSS. VSS2 can be biased to a level below VSS thereby allowing enough gate-to-source voltage for driving PMOS transistors of a selected WL to remain conducting even with a low value of VDDWL.

Figure 2D:
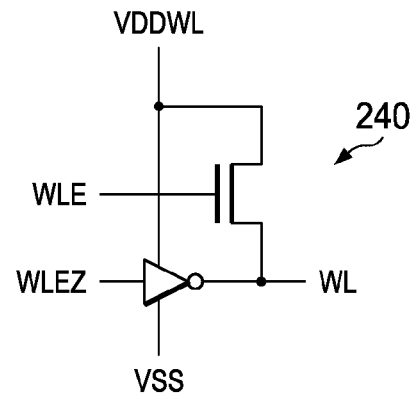

In FIG. 2D, yet another alternative WL driver 240 is illustrated. It is similar to the WL driver 200 except that an NMOS transistor is connected between VDDWL and WL. The gate of the added NOMS transistor is driven by a logic signal WLE that is complementary to the input WLEZ of the WL main driving inverter and is at VDD level when the WL is selected. When the WL is selected, the added NMOS is conducting and allows a low value of VDDWL to be easily passed to WL.

Figure 3A:
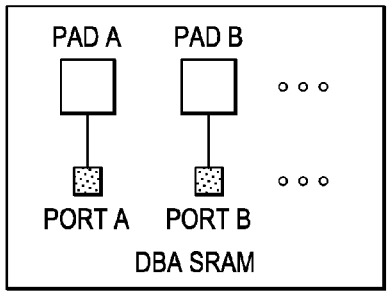
FIGS. 3A and 3B illustrate port connections constructed according to the principles of the present disclosure.
Figure 3B:
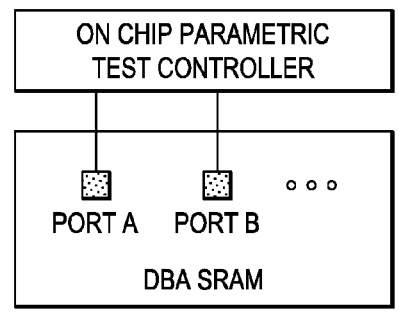

FIGS. 3A and 3B illustrate port connections, generally designated 300, 320, constructed according to the principles of the present disclosure.

In FIG. 3A, port A and port B are independently connected to bond pad A and bond pad B, as shown. Ports A and B can also be individually connected to probe pads or bumps. In addition to what is shown in FIG. 1A, 1B, 1C or 1D, an SRAM may further include a plurality of pads wherein each having a structure selected from the group consisting of probe pads, bond pads, and bumps, where a plurality of ports are individually connected to a plurality of pads.

In FIG. 3B, the SRAM is connected to an on-chip parametric controller. In addition to what is shown in FIG. 1A, 1B, 1C or 1D the SRAM may be connected to the on-chip parametric test controller through the ports.

Figure 4A:
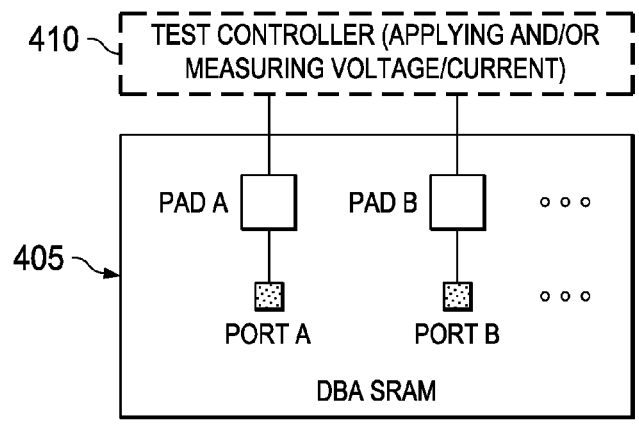
FIG. 4A illustrates a diagram of an SRAM test system constructed according to the principles of the present disclosure.

FIG. 4A illustrates a diagram of an SRAM test system, generally designated 400, constructed according to the principles of the present disclosure. The SRAM test system 400 includes a DBA SRAM 405 having a plurality of pads. The SRAM test system 400 also includes an off-chip test controller 410 having a plurality of connections that allow direct access to the pads from the test controller. The off-chip test controller 410 can apply a voltage on a pad or a port, apply a current on a pad or port, or leave the pad or the port floating. The off-chip test controller 410 can also measure a voltage or a current on the pad or the port.

Figure 4B:
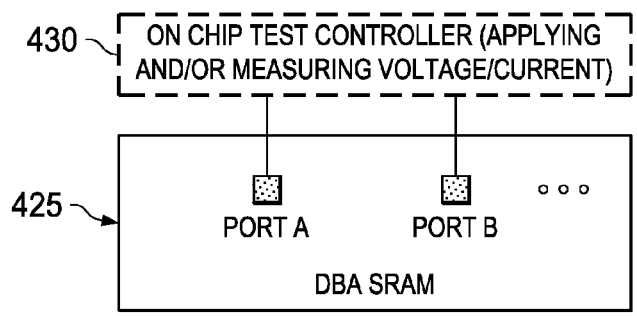
FIG. 4B illustrates a diagram of another SRAM test system constructed according to the principles of the present disclosure.

FIG. 4B illustrates a diagram of another SRAM test system, generally designated 420, constructed according to the principles of the present disclosure. The SRAM test system 420 includes a DBA SRAM 425 having a plurality of ports. The SRAM test system 420 also includes an on-chip test controller 430 that is directly connected to the ports without going through pads.

Figure 5A:
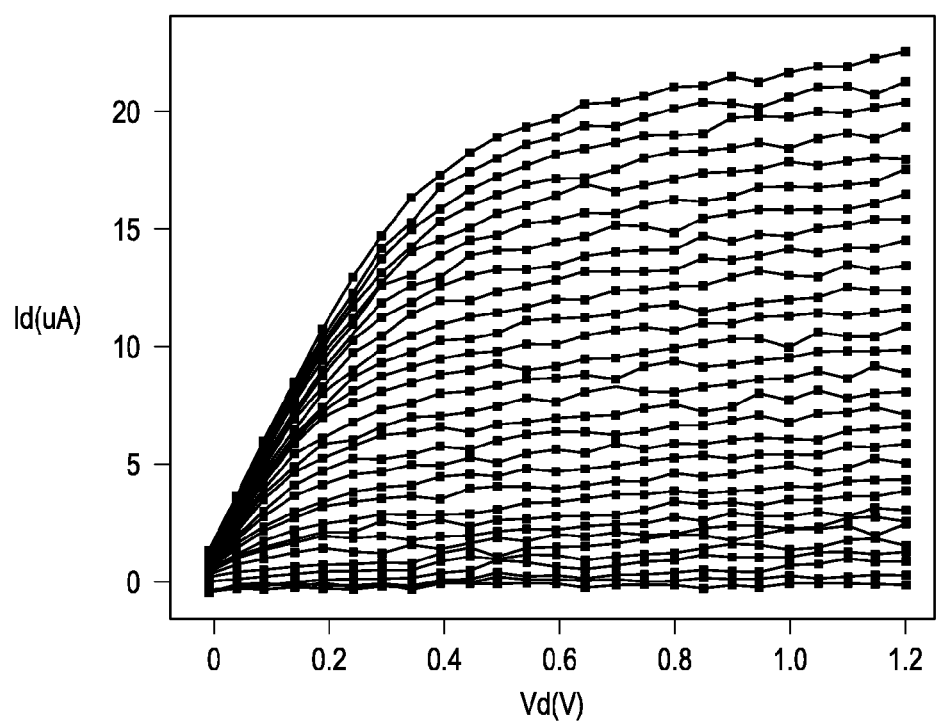
FIGS. 5A, 5B, and 5C illustrate typical Id-Vd curves for components of an SRAM memory cell as measured in a DBA mode.
Figure 5B:
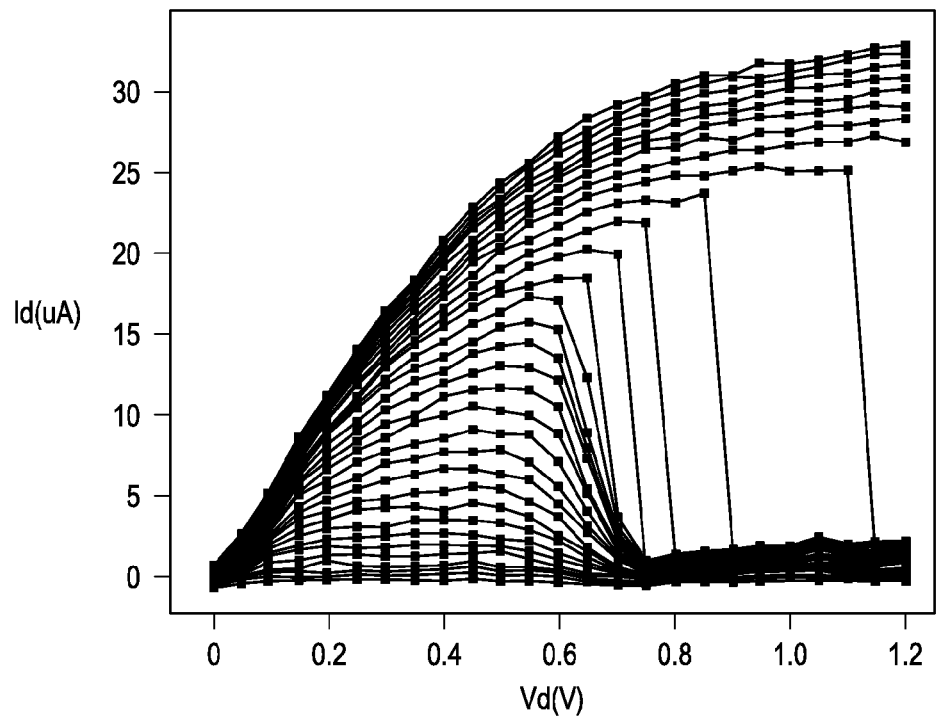
Figure 5C:
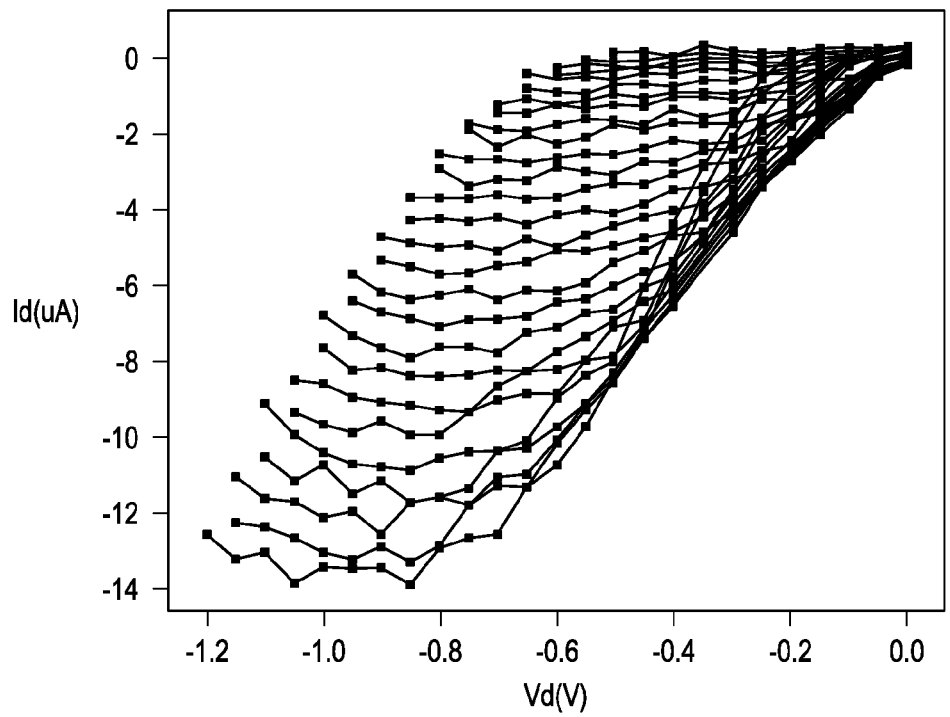

FIGS. 5A, 5B, and 5C illustrate typical Id-Vd curves for components of an SRAM memory cell, generally designated 500, 520, 540 as measured in a DBA mode. The Id-Vd curve 500 corresponds to a pass gate transistor in a read direction. The Id-Vd curve 520 corresponds to a driver transistor in a forward direction. The Id-Vd curve 540 corresponds to a load transistor in a forward direction.

Figure 6A:
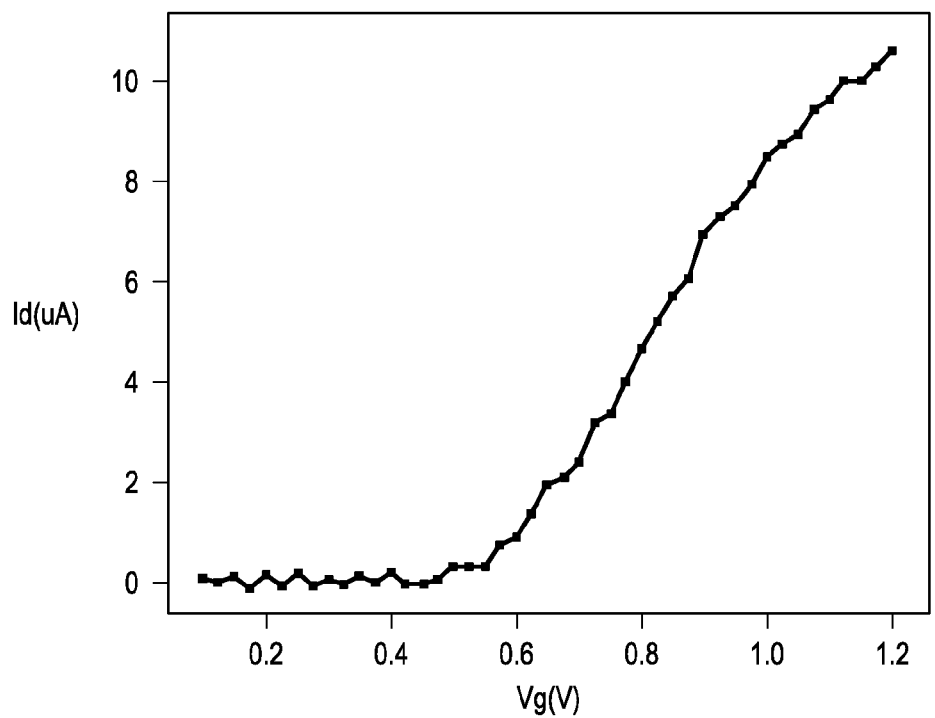
FIGS. 6A, 6B and 6C illustrate corresponding Id-Vg curves for pass gate, driver and load transistors, respectively.
Figure 6B:
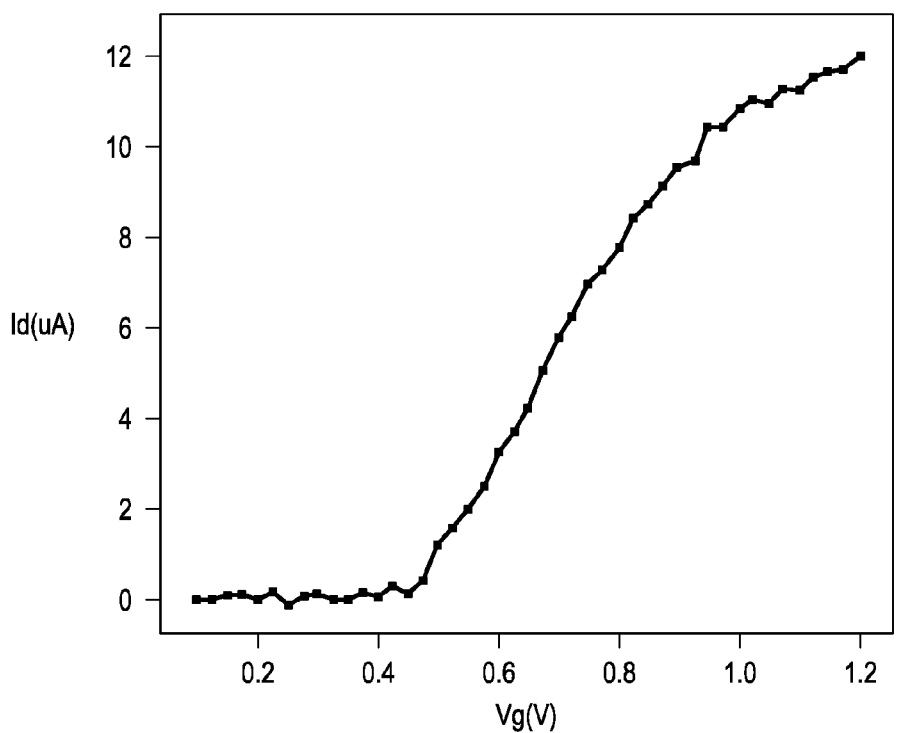
Figure 6C:
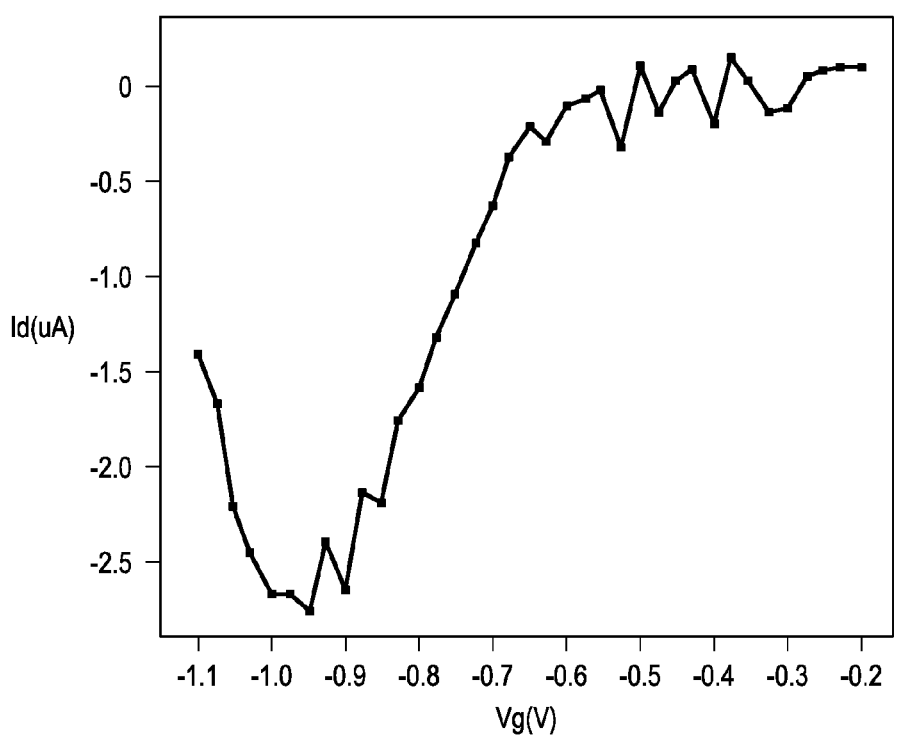

FIGS. 6A, 6B and 6C illustrate corresponding Id-Vg curves, generally designated 600, 620, 640, for pass gate, driver and load transistors, respectively. The Id-Vg curves 600, 620, 640 correspond to the pass gate, driver and load transistors, respectively.

Although these I-V curves are affected by transistors other than the one under test, as evidenced by the shape of the curves, certain low current regions of the I-V curves are independent of other transistors and are reasonably accurate. Some of these regions include the regions in FIGS. 6A, 6B, and 6C where |Id| is around 1 uA. These regions can be used to determine the transistor threshold voltage (Vt) such as constant current Vt (Vtcc) at |Id|=1 uA and |Vd|=0.2V.

Figure 7A:
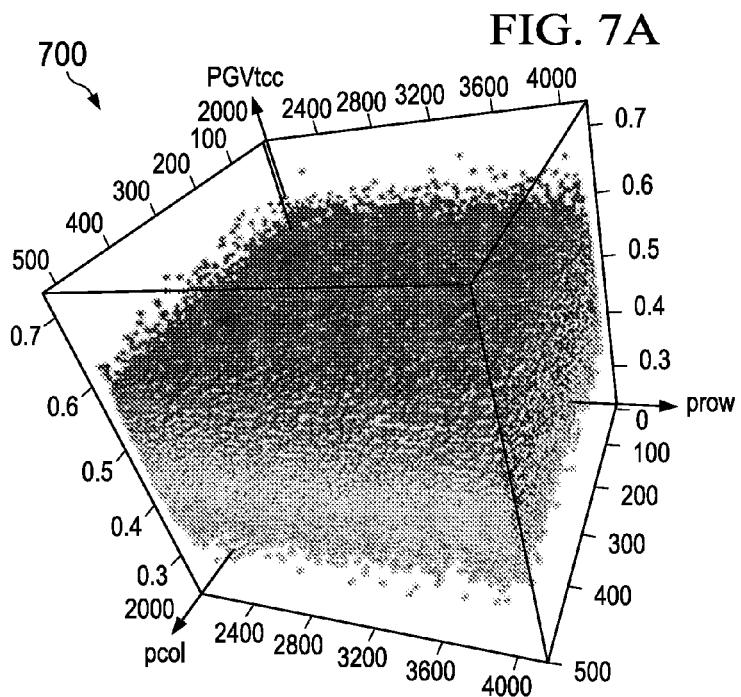
FIG. 7A illustrates an application of DBA, where one million DBA pass gate transistors (in read direction) constant current threshold voltage (Vtcc) data from a one Mb SRAM instance are plotted against physical row and column locations.

FIG. 7A illustrates an application of DBA, where one million DBA pass gate transistors (in read direction) Vtcc data from a one Mb SRAM instance are plotted against physical row and column locations. The data show that the transistor variations induced by the transistor locations in the array is negligible as compared with the intrinsic transistor variations due to random doping fluctuation, etc. More elaborate analysis of subtle variation can be done by plotting a Vt difference as a function of radial bit distance.

Figure 7B:
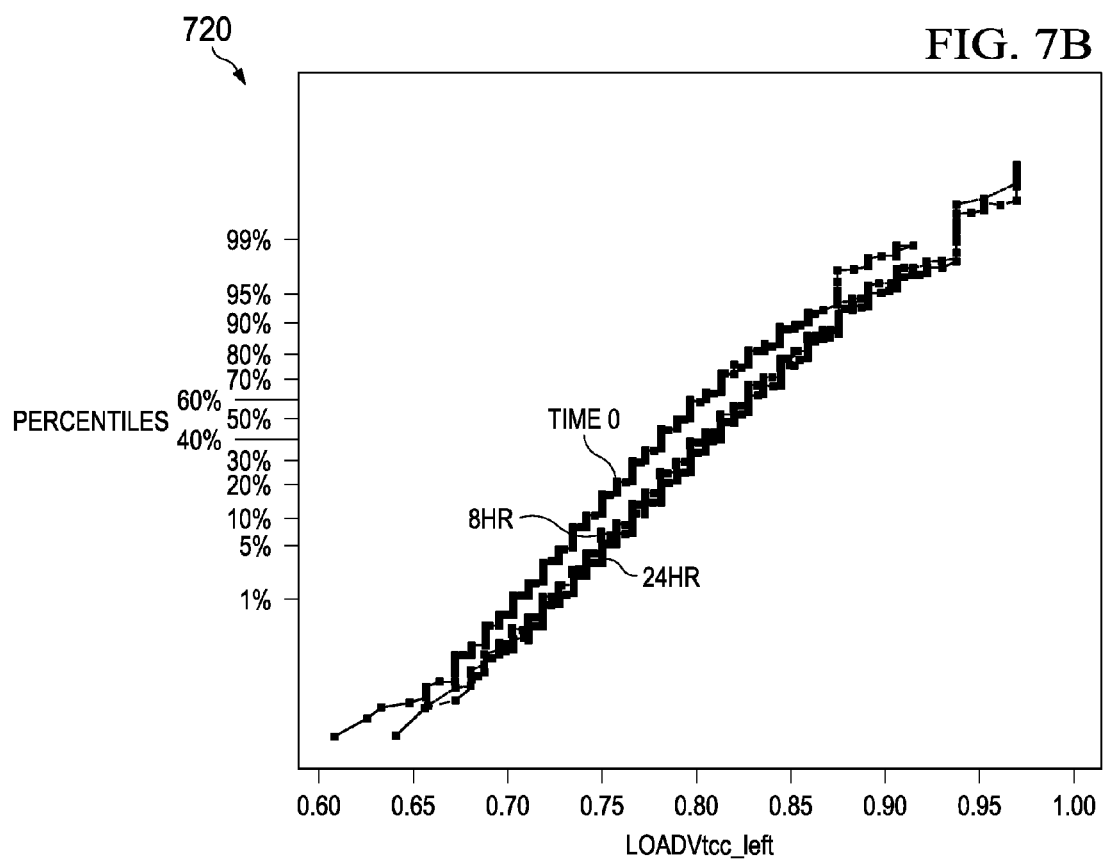
FIG. 7B illustrates another application of DBA, where NBTI Vtcc data of around 20,000 load transistors (in forward direction) are measured from a single bit array using DBA.

FIG. 7B illustrates another application of DBA, where NBTI Vtcc data of around 20,000 load transistors (in forward direction) are measured from a single bit array using DBA. The data show that NBTI induced variation is very little as compared with time-zero transistor variation. Note that the range of NBTI is very small at around 20 mV. Therefore, the high volume at Vt data collection, as enabled by DBA, is critical in accurate NBTI analysis.

Figures 7C, 7D:
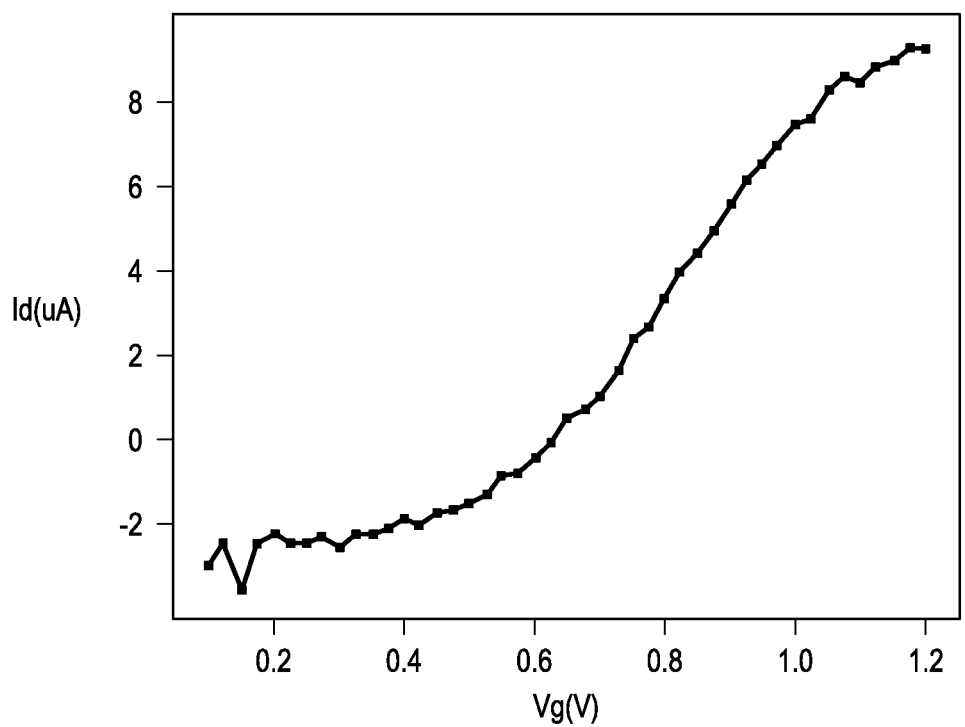
FIG. 7C illustrates another application of DBA, where transistor I-V data for a hard failing bit are collected using DBA.
FIG. 7D illustrates another application of DBA, where Vtccs of all transistors in three soft failing bits are collected.

FIG. 7C illustrates another application of DBA, where transistor I-V data for a hard failing bit are collected using DBA. A left driver Id-Vg curve 740 (at Vd=0.2) is shown and indicates that there is a 200 KOhm (2 uA at 0.2V) or so defective short between the left storage node and the WL. This is confirmed as a contact to gate short in physical failure analysis.

FIG. 7D illustrates another application of DBA, where Vtccs of all transistors in three soft failing bits are collected. The data indicate a weak pass gate as the cause of the first (write fail) bit, strong load as the cause of the second (write fail) bit, and strong left pass gate and strong right driver combination as the cause of the third (read disturb fail) bit.

Figure 8:
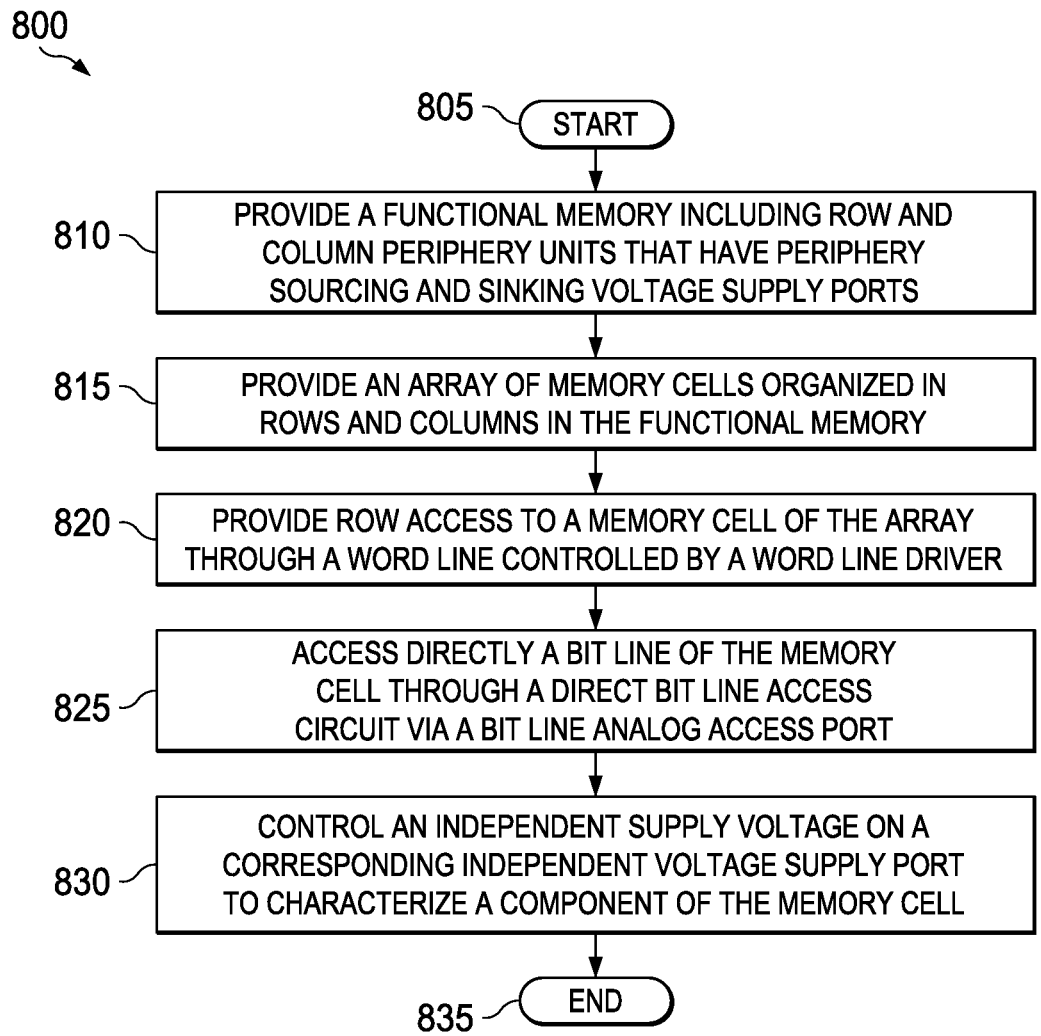
FIG. 8 illustrates a flow diagram of an embodiment of a method of characterizing a component of an integrated circuit carried out according to the principles of the present disclosure.

FIG. 8 illustrates a flow diagram of an embodiment of a method of characterizing a component of an integrated circuit, generally designated 800, carried out according to the principles of the present disclosure. The method 800 is for use with a functional memory and starts in a step 805. Then, a functional memory is provided that includes row and column periphery units that have periphery sourcing and sinking voltage supply ports in a step 810. An array of memory cells is provided that are organized in rows and columns in the functional memory in a step 815. Row access to a memory cell of the array is provided through a word line controlled by a word line driver in a step 820.

A bit line of the memory cell is directly accessed through a direct bit line access circuit via a bit line analog access port in a step 825. An independent supply voltage on a corresponding independent voltage supply port is controlled to characterize a component of the memory cell in a step 830.

In one embodiment, the component is a pass gate transistor, a driver transistor, or a load transistor. When the component is a pass gate transistor, the independent supply port is a word line driver sourcing supply port that supplies the gate voltage of the pass gate transistor. The memory cell includes a driver transistor that drives a source or drain terminal of the pass gate transistor, and the functional memory includes an array sourcing supply that is biased at an overdrive voltage that supplies the gate of the driver transistor. During load transistor measurement, the gate terminal of the load transistor is held at a low voltage or substantially at zero volts.

During driver transistor measurement, the array sourcing supply voltage is biased close to or substantially equals (within load transistor threshold voltage or 0.2V) the voltage on the gate of the driver transistor. In some embodiments, the word line is biased at an overdrive voltage, and the bit line current is measured with the word line on and off. Generally, the independent supply voltage may be swept over a range of voltages that can include overdrive voltages for at least one of the word line and an array voltage supply line to characterize the component. The method 800 ends in a step 835.

Specific examples for characterizing bit transistors in a functional SRAM carried out according to the principles of the present invention are described below, with reference to the DBA enabled SRAM of FIGS. 1A, 1B 1C and 1D and the general method of FIG. 8.

To characterize the left pass gate transistor Q1 in a read direction, VSS, VSBA and VSSA are held at zero volts. VDD, VNWA, VDDA, and PBLB are held at an overdrive voltage VH to maintain the source node SNT close to zero volts after the bit (memory cell) is initialized. The gate voltage on VDDWL and drain voltage on PBLT are individually swept while the drain current on PBLT is measured at each appropriate step. The right pass gate transistor Q2 in a read direction may be similarly characterized.

To characterize the left pass gate transistor Q1 in a write direction, VSS, VSBA, and the source PBLT are held at zero volts. VDD, VNWA, VDDA, and PBLB are held at VH. The bit is initialized such that the right storage node SNB is held close to VH. The drain voltage on VSSA (at a low voltage region) and the gate voltage on VDDWL are individually swept while the source current on PBLT is measured at each step. The right pass gate transistor Q2 in a write direction may be similarly characterized.

To characterize the left driver transistor Q3 in a forward direction, VSS, VSBA, and the source VSSA are held at zero volts. VDD and VDDWL are held at VH to strongly turn on the pass gates Q1, Q2 such that the BL voltage signal can be passed to the corresponding storage node with little loss. The gate voltage on PBLB is swept together with VDDA and VNWA and the drain voltage on PBLT is swept while the drain current on PBLT is measured at each step. The right driver transistor Q4 in forward direction may be similarly characterized.

To characterize the left driver transistor Q3 in a reverse direction, VSS, VSBA, and the source PBLT are held at zero volts. VDD and VDDWL are held at VH to strongly turn on the pass gates Q1, Q2 such that the BL voltage signal can be passed to the corresponding storage node with little loss. The gate voltage on PBLB is swept together with VDDA and VNWA and the drain voltage on VSSA is swept while the source current on PBLT is measured at each step. The right driver transistor Q4 in a reverse direction may be similarly characterized.

To characterize the left load transistor Q5 in a forward direction, VSS, VSBA, VSSA, and the gate PBLB are held at zero volts. VDD and VDDWL are held at VH to strongly turn on the pass gates Q1, Q2 such that BL voltage can be passed to the corresponding storage node with little loss. The source voltage on VDDA and the drain voltage on PBLT are individually swept while the drain current on PBLT is measured at each step. Note that Vgs is equal to −VDDA, and Vds is equal to VPBLT−VDDA. The right load transistor Q6 in a forward direction may be similarly characterized.

To characterize left load transistor Q5 in a reverse direction, VSS, VSBA, and the drain VDDA are held at zero volts. VDD and VDDWL are held at VH to strongly turn on the pass gates Q1, Q2 such that BL voltage can be passed to the corresponding storage node with little loss. The source voltage on PBLT is swept together with VNWA and VSSA and the gate voltage on PBLB is swept while the source current on PBLT is measured at each step. Note that Vgs is equal to VPBLB−VPBLT, and Vds is equal to −VPBLT. The right load transistor Q6 in a reverse direction may be similarly characterized.

The initialization of a bit is accomplished by applying write voltages to the bit line pair (such that one bit line is high and the other low) while turning on the WL (to VH if necessary).

To minimize noise in the bit line current measurement due to bit line leakage through the periphery and bit array, the BL (bit line) leakage with WL off is also measured and deducted from the BL current with WL on for each data point. To further minimize the noise in the BL current measurement due to IR drop along the bit line path, VDDBL and VSSBL are bias to an appropriate voltage level or are swept together with BL voltage to minimize the total BL leakage.

To characterize a left read current, all supplies are held at their respective intended operating voltage levels. The addressed bit is initialized such that SNT is low. PBLT and PBLB are held at the intended pre-charge voltage level. The currents on PBLT with WL turned on and turned off are measured and the difference is taken. The right read current may be similarly characterized.

To characterize a left trip voltage, all supplies are held at their respective intended operating voltage levels. The addressed bit is initialized such that SNT is high. PBLT and PBLB are held at the intended pre-charge voltage level, and WL is on. PBLT is swept from the pre-charge voltage level to zero volts while the current on either PBLT or PBLB is monitored. The PBLT voltage at which the PBLT or PBLB current abruptly changes is the left trip voltage. Other search methods, such as binary search, can be used instead, and resetting bit state at each search step may be needed. The right trip voltage may be similarly characterized.

Figure 9:
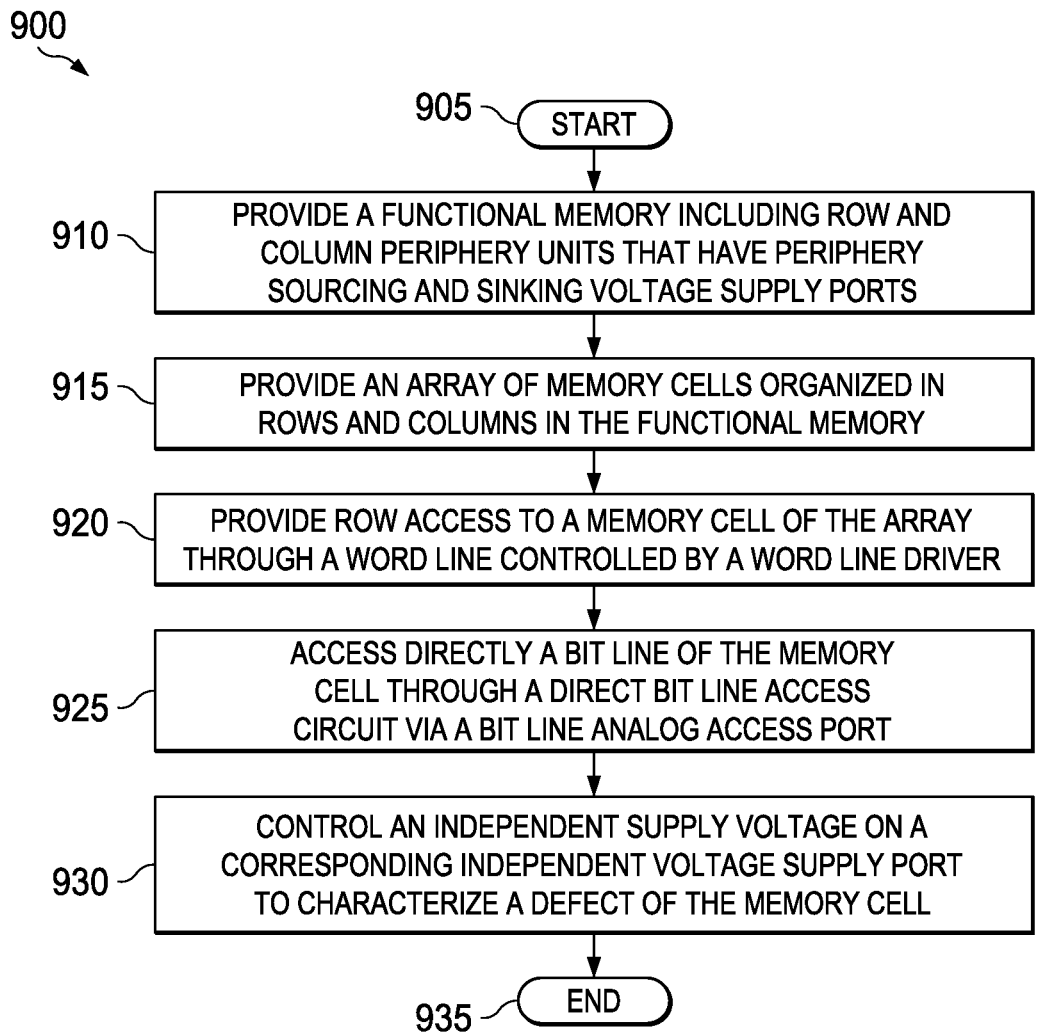
FIG. 9 illustrates a flow diagram of an embodiment of a method of characterizing a defect of an integrated circuit carried out according to the principles of the present disclosure.

FIG. 9 illustrates a flow diagram of an embodiment of a method of characterizing a defect of an integrated circuit, generally designated 900, carried out according to the principles of the present disclosure. The method 900 is for use with a functional memory and starts in a step 905. Then, a functional memory is provided that includes row and column periphery units that have periphery sourcing and sinking voltage supply ports in a step 910. An array of memory cells is provided that is organized in rows and columns in the functional memory in a step 915. Row access to a memory cell of the array is provided through a word line controlled by a word line driver in a step 920.

A bit line of the memory cell is directly accessed through a direct bit line access circuit via a bit line analog access port in a step 925. An independent supply voltage on a corresponding independent voltage supply port is controlled to characterize a defect of the memory cell in a step 930.

In characterizing a defect short, a change in current on the bit line analog access port is measured corresponding to the change in the voltage of one independent supply port. The independent supply voltage is an array sinking supply, an array sourcing supply voltage, and array NWELL supply voltage, an array substrate supply voltage, an bit line pre-charge supply voltage or a bit line sinking supply voltage. A defect short is characterized by measuring a change in the current on the bit line port corresponding to the word line on and off, or measuring a change in the current on the bit line port corresponding to the change in voltage on a word line.

In characterizing a defect open, the bit line currents corresponding to the word line on and off are measured and their difference is calculated. Additionally, each transistor along the path between the bit line and a voltage supply is strongly turned on. Correspondingly, the voltages are supplied such that there is a significant voltage difference between the bit line and the voltage supply. Generally, the independent supply voltage may be swept over a range of voltages that can include overdrive voltages for at least one of the word line and an array voltage supply line to characterize the defect. The method 900 ends in a step 935.

Specific examples for characterizing defective leakages along a bit line or in a bit in a functional SRAM carried out according to the principles of the present disclosure are described below, with reference to the DBA enabled SRAM structure of FIGS. 1A, 1B 1C and 1D and the general method of FIG. 9.

To characterize BL-high leakage, all supplies are held at their respective operating voltages. PBLT and PBLB are held at a pre-charge voltage. The leakage on PBLT and PBLB with the WL off is measured.

To characterize BL-low leakage, all supplies are held at their respective operating voltages. PBLT and PBLB are held at zero volts. The leakage on PBLT and PBLB with the WL off are measured.

To characterize BL-to-WL leakage, VSS and VSBA are held at zero volts. VDD is held at a first bias voltage VBIAS1 such that the periphery is functioning. All other supplies as well as PBLT and PBLB are held at a second bias voltage VBIAS2 (e.g., around 0.5V). The leakage on PBLT and PBLB with the WL on and off are measured. The leakages for the WL-off condition are individually deducted from the respective WL-on leakages.

To characterize BL-to-VSS leakage (assuming VSS also supplies the substrate), VSS and VSBA are held at zero volts. All other supplies as well as PBLT and PBLB are held at a bias voltage VBIAS such that the periphery is functioning. The WL-off leakages on PBLT and PBLB are measured. The BL-to-WL leakages (scaled with voltage) separately measured for all bits along the selected column are deducted from this leakage.

To characterize BL-to-VDD leakage, VDD and VDDWL are held at a bias voltage VBIAS such that the periphery is functioning. All other supplies as well as PBLT and PBLB are held at zero volts. The WL-off leakage on PBLT and PBLB are measured.

To characterize BLT-to-BLB leakage, VSS, VSBA, and PBLB are held at zero volts. VDD and VDDWL are held at a first bias voltage VBIAS1 such that the periphery is functioning. All other supplies and PBLT are held at a second bias voltage VBIAS2 (e.g., around 0.5V), and the WL is off. The leakage on PBLT is measured. PBLB is held at VBIAS2. The leakage on PBLT is measured again and deducted from first measurement.

To characterize BL-to-VDDBL leakage, VDD, VDDWL, and VDDBL are held at a bias voltage VBIAS such that the periphery is functioning. All other supplies as well as PBLT and PBLB are held at zero volts. The WL-off leakage on PBLT and PBLB are measured. The BL-to-VDD leakages (scaled with voltage) measured separately are individually deducted from the respective leakages.

To characterize BL-to-VSSBL leakage, VSS, VSBA, and VSSBL are held at zero volts. VDD and VDDWL are held at a first bias voltage VBIAS1 such that the periphery is functioning. All other supplies as well as PBLT and PBLB are held at a second bias voltage VBIAS2 (e.g., around 0.5V), and the WL is off. The leakages on PBLT and PBLB are measured. VSSBL is raised to VBIAS2. The leakages on PBLT and PBLB are measured again and deducted from the first measurements.

To characterize SN-to-BL leakage, VSS, VSSBL, VSBA and VDDBL are held at zero volts. All other supplies are held at a bias voltage VBIAS within the SRAM operating voltage range. All bits along the selected column are initialized such that their SNT nodes are low. PBLT and PBLB are held at a bias (e.g., zero volts), and the WL is off. The first leakages on PBLT and PBLB are measured. The addressed bit is written to the opposite state. PBLT and PBLB are held at zero volts, and the WL is off. The second leakages on PBLT and PBLB are measured. The differences between the respective first and second leakages are calculated.

Alternatively, to characterize SN-to-BL leakage, VSS, VSSBL, VSBA and VDDBL are held at zero volts. All other supplies as well as PBLB are held at a bias voltage VBIAS within the SRAM operating voltage range. All bits along the selected column are initialized such that their SNT nodes are low. PBLT is held at zero volts, and the WL is off. The first leakage on PBLT is measured. The addressed bit is written to the opposite state. PBLT is held at zero volts, and the WL is off. The second leakage on PBLT is measured. The difference between the first and second PBLT leakages is calculated. SNB-to-BL leakage may be similarly measured.

To characterize SN-to-WL leakage, VDD and VDDWL are held at a bias voltage VBIAS within the SRAM operating voltage range. All other supplies as well as PBLT and PBLB are held at zero volts, and the WL is on. The leakages on PBLT and PBLB are measured. The BL-to-WL leakages (scaled with voltage) are measured separately and deducted from the respective leakages.

To characterize SN-to-VSBA leakage, VSS and VSBA are held at zero volts. VDD and VDDWL are held at a first bias voltage VBIAS1 within the SRAM operating voltage range. All other supplies as well as PBLT and PBLB are held at a second bias voltage VBIAS2 (e.g., around 0.2V), and the WL is on. The leakages on PBLT and PBLB are measured. The BL-to-WL and SN-to-WL leakages (scaled with voltage) are measured separately and deducted from the respective leakages.

Alternatively, to characterize SN-to-VSBA leakage, VSS and VSBA are held at zero volts. VDD and VDDWL are held at an overdrive voltage VH (e.g., 1.6V). VDDBL, VSSA, VDDA, VNWA, PBLT, and PBLB are held at a first bias voltage VBIAS1 (e.g., 0.6V) around the pass gate Vt. The WL is on. The first PBLT/PBLB currents are measured. VDDWL is changed to VBIAS1, and the second PBLT/PBLB currents are measured. VDD and VDDWL are changed to a second bias voltage VBIAS2 (e.g., 1V), where VBIAS2 is equal to the quantity (VH−VBIAS1). VDDBL, VSSA, VDDA, VNWA, PBLT, and PBLB are changed to zero volts, and the WL is on. The third PBLT/PBLB currents are measured. The WL is changed to off. The fourth PBLT/PBLB currents are measured. The (first-second)-(third-fourth) PBLT/PBLB currents are calculated as the T/B side SN-to-VSBA leakage.

To characterize SN-to-VSSA leakage, VSS, VSBA, and VSSA are held at zero volts. VDD and VDDWL are held at a first bias voltage VBIAS1 within the SRAM operating voltage range. All other supplies as well as PBLT and PBLB are held at a second bias voltage VBIAS2 (e.g., around 0.2V). The WL is on. The leakages on PBLT and PBLB are measured. The SN-to-VSBA leakages (scaled with voltage) measured separately are deducted from the respective leakages.

Alternatively, to characterize SN-to-VSSA leakage, VSS, VSBA, VDDBL, VSSA, VDDA, VNWA, PBLT, and PBLB are held at zero volts. VDD and VDDWL are held at a first bias voltage VBIAS1 (e.g., 1.2V) within the SRAM operating voltage range. The WL is on. First PBLT/PBLB currents are measured. VSSA is changed to a second bias voltage VBIAS2 (e.g., 0.6V). Second PBLT/PBLB currents are measured. The (first-second) PBLT/PBLB currents are calculated as the T/B side SN-to-VSSA leakages.

To characterize SN-to-VNWA leakage, VSS, VSBA, and VNWA are held at zero volts. VDD and VDDWL are held at a first bias voltage VBIAS1 within the SRAM operating voltage range. All other supplies as well as PBLT and PBLB are held at a second bias voltage VBIAS2 (e.g., around 0.2V). The WL is on. The leakages on PBLT and PBLB are measured. The SN-to-VSBA leakages (scaled with voltage) measured separately are deducted from the respective leakages.

Alternatively, to characterize SN-to-VNWA leakage, VSS, VSBA, VDDBL, VSSA, VDDA, VNWA, PBLT, and PBLB are held at zero volts. VDD and VDDWL are held at a first bias voltage VBIAS1 (e.g., 1.2V) within the SRAM operating voltage range. The WL is on. First PBLT/PBLB currents are measured. VNWA is changed to a second bias voltage VBIAS2 (e.g., 1.2V). Second PBLT/PBLB currents are measured. The (first-second) PBLT/PBLB currents are calculated as the T/B side SN-to-VNWA leakages.

To characterize SN-to-VDDA leakage, VSS, VSBA, and VDDA are held at zero volts. VDD and VDDWL are held at a first bias voltage VBIAS1 within the SRAM operating voltage range. All other supplies as well as PBLT and PBLB are held at a second bias voltage VBIAS2 (e.g., around 0.2V). The WL is on. The leakages on PBLT and PBLB are measured. The SN-to-VSBA leakages (scaled with voltage) measured separately are deducted from the respective leakages.

Alternatively, to characterize SN-to-VDDA leakage, VSS and VSBA are held at zero volts. VDDBL, VSSA, VDDA, VNWA, PBLT, and PBLB are held at a first bias voltage VBIAS1 (e.g. 0.6V). VDD and VDDWL are held at an overdrive voltage VH (e.g., 1.6V). The WL is on. First PBLT/PBLB currents are measured. VDDA is changed to zero volts. Second PBLT/PBLB currents are measured. The (second-first) PBLT/PBLB currents are calculated as the T/B side SN-to-VDDA leakages.

Alternatively, to characterize SN-to-VDDA leakage, VSS, VSBA, VDDBL, VSSA, VDDA, PBLT and PBLB are held at zero volts. VNVA is held at a bias voltage VBIAS (e.g., 0.6V). VDD and VDDWL are held at an operational voltage (e.g., 1.2V). The WL is on. First PBLT/PBLB currents are measured. VDDA is changed to VBIAS. Second PBLT/PBLB currents are measured. The (first-second) PBLT/PBLB currents are calculated as the T/B side SN-to-VDDA leakages.

To characterize SNT-to-SNB leakage, VSS, VSBA, and PBLB are held at zero volts. VDD and VDDWL are held at a first bias voltage VBIAS1 within the SRAM operating voltage range. All other supplies and PBLT are held at a second bias voltage VBIAS2 (e.g., around 0.2V). The WL is on. The leakage on PBLT is measured. PBLT is changed to zero volts, and PBLB is changed to VBIAS2. The leakage on PBLB is measured. The SN-to-VSBA leakages (scaled with voltage) measured separately are deducted from the respective leakages.

Alternatively, to characterize SNT-to-SNB leakage, VSS and VSBA are held at zero volts. VDDBL, VSSA, and VDDA are held at a first low bias voltage VBIAS1 (e.g., 0.2V). VNWA is held at a second bias voltage (e.g., 0.4V) slightly higher than VBIAS1. PBLT and PBLB are respectively held at VBIAS1 and zero volts. The WL is on. First PBLT current is measured. PBLB is changed to VBIAS2. Second PBLT current is measured. The (first-second) PBLT current is calculated as the T side SNT-to-SNB leakage. The B side SNT-to-SNB leakage is similarly measured.

Specific examples for detecting or characterizing defective opens in a bit in a functional SRAM according to the principles of the present invention are described below, with reference to the DBA enabled SRAM structure of FIGS. 1A, 1B, 1C and 1D and the general method flow of FIG. 9.

To detect or characterize a defect open along the BLT to VSSA path through a left pass gate and left driver, VSS, VSBA, and VSSA are held at zero volts. VDD and VDDWL are held at a first bias voltage VBIAS1 (e.g., around 1.6V). VDDA and PBLB are held at a second bias voltage VBIAS2 (e.g., around 1.4V). PBLT is held at a third bias voltage VBIAS3 (e.g., around 0.2V). The WL is on. The first current on PBLT is measured. The WL is changed to off. The second current on PBLT is measured. The difference between the first and second currents is calculated as the PGDR current. An outstanding low PGDR current indicate an open along the BLT to VSSA path through left pass gate and left driver (e.g., caused by an open BL or VSSA contact).

To detect or characterize a defect open along the BLT to VDDA path through a left pass gate and left load, VSS, VSBA, VSSA, and PBLB are held at zero volts. VDD and VDDWL are held at a first bias voltage VBIAS1 (e.g., around 1.6V). VDDA is held at a second bias voltage VBIAS2 (e.g., around 1.4V). PBLT is held at a third bias voltage VBIAS3 (e.g., around 0.4V). The WL is on. The first current on PBLT is measured. The WL is changed to off. The second current on PBLT is measured. The difference between the second and first currents is calculated as the PGLD current. An outstanding low PGLD current indicates an open along the BLT to VDDA path through the left pass gate and left load (e.g., caused by an open stretch contact).

Other defect shorts and opens may be similarly detected, measured or characterized such as a short between a storage node in one bit to a storage node in another bit.

While the methods and examples disclosed herein have been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps is not a limitation of the present disclosure.

Illustrated embodiments of the present disclosure are applicable to both embedded and discrete memories. Additionally, although embodiments of the memory cell described above are based on a standard 6T SRAM cell as an example, the embodiments may be based on other memory cells such as a content addressable memory (CAM) cell, a latch cell or another SRAM cell. Other SRAM cells include, but are not limited to, types such as those being load-less, having 4T, 5T, 6T, 7T, 8T, 9T or 10T structures, being single sided, being dual port, two port, or multi-port or having a column select line.

Therefore, those skilled in the art to which the disclosure relates will appreciate that other and further additions, deletions, substitutions and modifications may be made to the described example embodiments without departing from the disclosure.

What is claimed is:

1. An integrated circuit including a functional memory, the functional memory comprising:
row and column periphery units having periphery sourcing and sinking voltage supply ports;
an array of memory cells connected to the row and column periphery units that are organized in corresponding rows and columns;
a word line connected between the row periphery unit and a memory cell of the array, the word line being controlled by a word line driver to provide row access to the memory cell, the word line being coupled to a word line driver sourcing voltage supply, the row periphery unit being coupled to a periphery sourcing voltage supply and a periphery sinking voltage supply;

a bit line connected between the column periphery unit and the memory cell, the bit line being controlled by direct bit line access circuitry to provide direct bit line access to the memory cell through a bit line analog access port, the bit line analog access port being coupled to one of a bond pad, a probe pad, a bump, and an on-chip test controller, the column periphery unit being coupled to the periphery sourcing voltage supply and the periphery sinking voltage supply; and an independent voltage supply port connected to the memory cell, the independent voltage supply port being coupled to an independent array voltage supply, the independent array voltage supply having a voltage that is not constrained by a voltage of another voltage supply including the word line driver sourcing voltage supply, the periphery sourcing voltage supply, and the periphery sinking voltage supply; wherein the word line driver sourcing voltage supply has a voltage that is not constrained by a voltage of another voltage supply, the periphery sourcing voltage supply has a voltage that is not constrained by a voltage of another voltage supply, and the periphery sinking voltage supply has a voltage that is not constrained by a voltage of another voltage supply.

2. The integrated circuit as recited in claim 1 wherein the independent voltage supply port is a first independent voltage supply port that provides direct accessibility to the word line, and the functional memory further comprises a second independent voltage supply port that provides direct accessibility to an array voltage supply line.

3. The integrated circuit as recited in claim 1 wherein the bit line analog access port is connected to the bit line through an all P-channel pass-transistor path and an all N-channel pass transistor path connected in parallel.

4. The integrated circuit as recited in claim 1 wherein the independent voltage supply port is a port selected from the group consisting of:
an array sourcing voltage supply port;
an array sinking voltage supply port;
an array Nwell supply port; and
an array substrate voltage supply port.

5. The integrated circuit as recited in claim 1 wherein the independent voltage supply port is a word line sourcing voltage supply port, and the functional memory further comprises a word line sinking voltage supply port.

6. The integrated circuit as recited in claim 1 wherein the bit line analog access port is connected to one of the bond pad, the probe pad, the bump, and the on-chip test controller.

7. The integrated circuit as recited in claim 1 wherein the bit line analog access port is connected to a probe pad, a bond pad, or a bump.

8. The integrated circuit as recited in claim 1 wherein the bit line analog access port is connected to a data port that is used to access the bit line in a functional mode.

9. The integrated circuit as recited in claim 1 wherein the bit line analog access port is connected to an on-chip parametric measurement structure.

10. The integrated circuit as recited in claim 1 wherein a portion of the path from the bit line analog access port to the bit line is a circuit for functional operation of the memory.

11. The integrated circuit as recited in claim 10 wherein the portion of the path is isolated from a sense amplifier by an isolation circuit having a p-channel transistor.

12. The integrated circuit as recited in claim 1 wherein the independent voltage supply port is connected to a probe pad, a bond pad, or a bump.

13. The integrated circuit as recited in claim 2 wherein the first and second independent voltage supply ports are an array sourcing voltage supply port and a word line driver sourcing voltage supply port.

14. The integrated circuit as recited in claim 2 wherein one of the first and second independent voltage supply ports is a bit line pre-charge supply port.

15. The integrated circuit as recited in claim 2 wherein the first independent voltage supply port is connected to one side of the memory cell and the second independent voltage supply port is connected to the other side of the memory cell.

16. The integrated circuit as recited in claim 2 wherein the first independent voltage supply port is a word line sourcing voltage supply port and the second independent voltage supply port is a word line sinking voltage supply port.

17. The integrated circuit as recited in claim 1 wherein the word line driver includes an N-channel transistor having a source or drain of the transistor connected to the word line, the other source or drain of the transistor connected to a word line driver sourcing voltage supply port and the gate of the transistor connected to a node that is the logical inverse of the input of the last inverting stage of the word line driver.

18. A method of characterizing an integrated circuit, comprising:
providing a functional memory including row and column periphery units that are coupled to a periphery sourcing voltage supply and a periphery sinking voltage supply and also have periphery sourcing and sinking voltage supply ports;
providing an array of memory cells organized in rows and columns in the functional memory;
providing row access to a memory cell of the array through a word line controlled by a word line driver, the word line being coupled to a word line driver sourcing voltage supply;
accessing directly a bit line of the memory cell through a direct bit line access circuit via a bit line analog access port, the bit line analog access port being coupled to one of a bond pad, a probe pad, a bump, and an on-chip test controller; and
controlling an independent array supply voltage on a corresponding independent voltage supply port to characterize a component of the memory cell, the independent array supply voltage being capable of having a voltage that is not constrained by a voltage of another voltage supply including the word line driver sourcing voltage supply, the periphery sourcing voltage supply, and the periphery sinking voltage supply; wherein the word line driver sourcing voltage supply has a voltage that is not constrained by a voltage of another voltage supply, the periphery sourcing voltage supply has a voltage that is not constrained by a voltage of another voltage supply, and the periphery sinking voltage supply has a voltage that is not constrained by a voltage of another voltage supply.

19. The method as recited in claim 18 wherein the independent array supply voltage is swept over a range of voltages applied to the corresponding independent voltage supply port for the word line to characterize the component.

20. The method as recited in claim 18 wherein the independent array supply voltage is swept over a range of voltages applied to the corresponding independent voltage supply port for an array voltage supply line to characterize the component.

21. The method as recited in claim 18 wherein a first bit line current with the word line on and a second bit line current with the word line off are measured, and a difference between the first and second bit line currents is calculated.

22. The method as recited in claim 18 wherein an independent word line driver sourcing supply voltage is applied on a corresponding independent word line driver sourcing voltage supply port to independently bias a gate of a pass gate transistor of the memory cell.

23. The method as recited in claim 22 wherein an overdrive voltage is applied through an array sourcing voltage supply port to a gate of a driver transistor that drives one of a source or drain terminal of the pass gate transistor.

24. The method as recited in claim 18 wherein a threshold voltage of a transistor of the memory cell is characterized.

25. The method as recited in claim 18 wherein a word line driver sourcing supply voltage is biased substantially higher than an array sourcing supply voltage to characterize a driver transistor or a load transistor of the memory cell.

26. The method as recited in claim 25 wherein a source, drain, or gate terminal voltage of the driver transistor or the load transistor is applied through the bit line analog access port.

27. The method as recited in claim 25 wherein the array sourcing supply voltage is biased to within about plus or minus 0.2 volts of a voltage on a gate of the driver transistor.

28. The method as recited in claim 25 wherein a gate voltage of the load transistor is held at less than 0.2 volts.

29. The method as recited in claim 25 wherein a source or drain voltage of the load transistor is biased through the array sourcing supply voltage.

30. A method of characterizing an integrated circuit, comprising:
providing a functional memory including row and column periphery units that are coupled to a periphery sourcing voltage supply and a periphery sinking voltage supply and also have periphery sourcing and sinking voltage supply ports;
providing an array of memory cells organized in rows and columns in the functional memory;
providing row access to a memory cell of the array through a word line controlled by a word line driver, the word line being coupled to a word line driver sourcing voltage supply;
accessing directly a bit line of the memory cell through a direct bit line access circuit via a bit line analog access port, the bit line analog access port being coupled to one of a bond pad, a probe pad, a bump, and an on-chip test controller; and
controlling an independent array supply voltage on a corresponding independent voltage supply port to characterize a defect of the memory cell by measuring current differences; wherein the independent array supply voltage, the word line driver sourcing voltage supply, the periphery sourcing voltage supply, and the periphery sinking voltage supply are not constrained by a voltage of another voltage supply.

31. The method as recited in claim 30 wherein the independent supply voltage is swept over a range of voltages applied to the corresponding independent voltage supply port for the word line to characterize the defect.

32. The method as recited in claim 30 wherein the independent supply voltage is swept over a range of voltages applied to the corresponding independent voltage supply port for an array voltage supply line to characterize the defect.

33. The method as recited in claim 30 wherein a current of a short or open of the memory cell is characterized.

34. The method as recited in claim 30 wherein a first bit line current with the word line on and a second bit line current with the word line off are measured through the bit line analog access port, and a difference between the first and second bit line currents is calculated.

35. The method as recited in claim 30 wherein the defect is a defect short and the measuring current differences includes measuring a change in current from the bit line analog access port that corresponds to a change in voltage at a circuit node of the memory cell.

36. The method as recited in claim 30 wherein the defect is a defect open and the measuring current differences includes measuring a change in current corresponding to the word line on and off; wherein there is a significant voltage difference between the bit line and the independent array supply voltage.

* * * * *